(12) United States Patent
Huang

(10) Patent No.: US 8,351,202 B2
(45) Date of Patent: Jan. 8, 2013

(54) CONTAINER DATA CENTER

(75) Inventor: Chao-Jui Huang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 84 days.

(21) Appl. No.: 13/149,796

(22) Filed: May 31, 2011

(65) Prior Publication Data

US 2012/0234514 A1    Sep. 20, 2012

(30) Foreign Application Priority Data

Mar. 16, 2011   (TW) .................................. 100109034

(51) Int. Cl.
*H05K 7/20* (2006.01)
(52) U.S. Cl. .................. 361/690; 361/688; 361/715
(58) Field of Classification Search .................. 361/690
See application file for complete search history.

(56) References Cited

U.S. PATENT DOCUMENTS

| | | | |
|---|---|---|---|
| 5,544,012 A * | 8/1996 | Koike ........................... | 361/695 |
| 6,002,584 A * | 12/1999 | Messmer et al. .............. | 361/690 |
| 6,877,551 B2 * | 4/2005 | Stoller ............................ | 165/47 |
| 7,355,848 B1 * | 4/2008 | Hodge et al. .................. | 361/690 |
| 7,397,661 B2 * | 7/2008 | Campbell et al. ............. | 361/696 |
| 8,072,752 B2 * | 12/2011 | Wantschik ..................... | 361/695 |
| 8,248,012 B2 * | 8/2012 | Betta et al. ..................... | 318/459 |

* cited by examiner

*Primary Examiner* — Gregory Thompson
(74) *Attorney, Agent, or Firm* — Altis Law Group, Inc.

(57) ABSTRACT

A container data center includes a mobile container and a number of server systems. The mobile container includes a bottom wall, an inner container portion and an outer container portion. The inner container portion includes a first top wall opposite to the bottom wall, and a number of first sidewalls connected between the first top wall and the bottom wall. The outer container portion includes a second top wall facing the bottom wall, and a number of second sidewalls connected between the second top wall and the bottom wall. The second sidewalls surround the inner container portion. A passage is formed between the first and second top walls and between the first and second sidewalls. The second top wall and the second sidewalls define a number of through holes. The server systems are installed in the inner container portion.

7 Claims, 1 Drawing Sheet

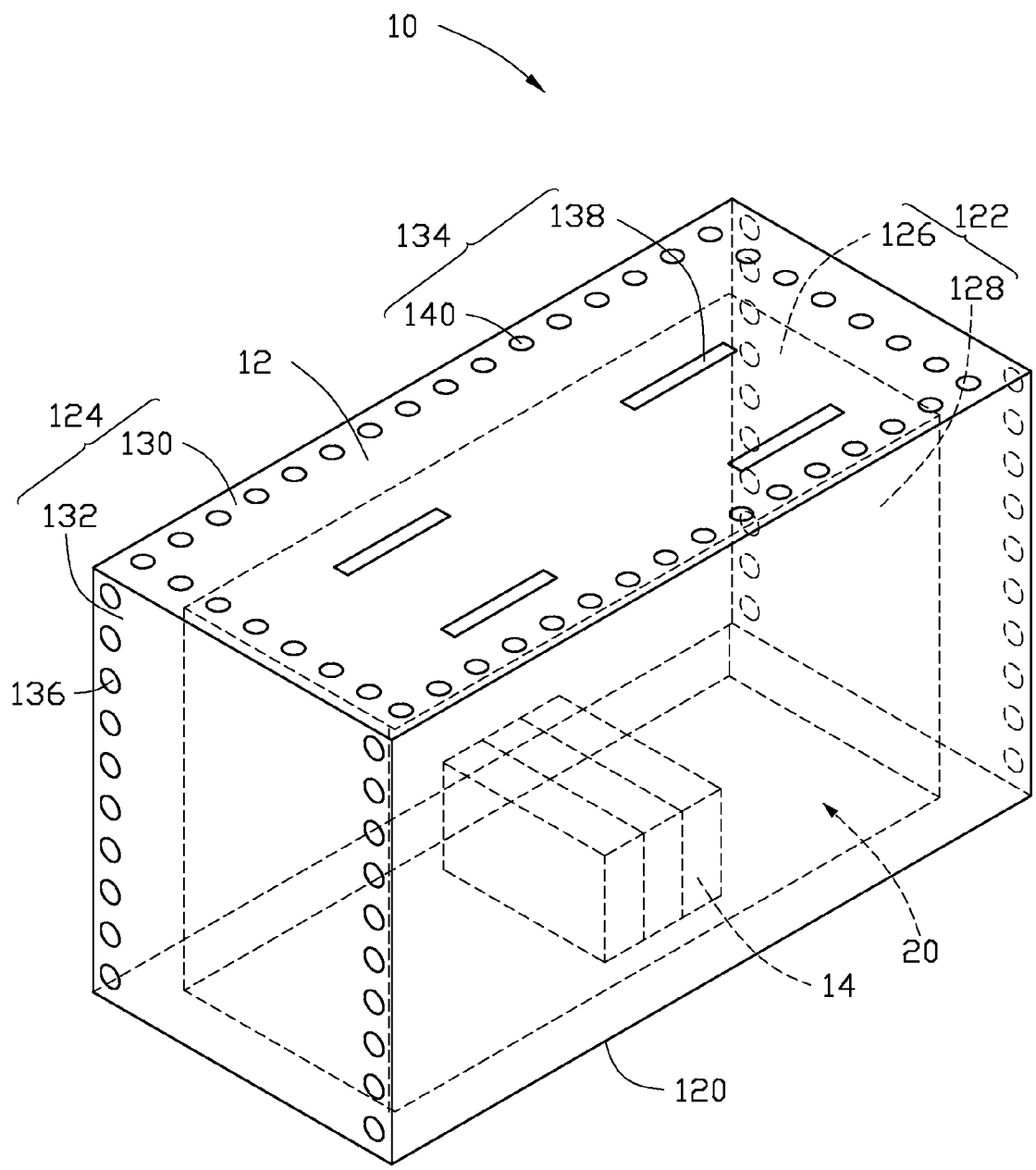

CONTAINER DATA CENTER

BACKGROUND

1. Technical Field

The present disclosure relates to data centers, and particularly to a container data center.

2. Description of Related Art

With increasingly heavy duty use of on-line applications, the need for computer data centers has increased rapidly. Data centers are centralized computing facilities that include many servers. Container data centers each typically includes a heat-conductive container where the servers are housed. The heat-conductive container is generally exposed to the sun, which causes the container to grow hot. A method for cooling the container is adding air conditioners. However, this consumes too much power and is environmentally-unfriendly.

What is needed, therefore, is a container data center, to overcome the above mentioned limitations.

BRIEF DESCRIPTION OF THE DRAWING

Many aspects of the present embodiments can be better understood with reference to the following drawing. The components in the drawing are not necessarily drawn to scale, the emphasis instead being placed upon clearly illustrating the principles of the present embodiments.

The FIGURE is schematic, isometric view of a container data center in accordance with an exemplary embodiment.

DETAILED DESCRIPTION

The disclosure, including the accompanying drawing, is illustrated by way of example and not by way of limitation.

Referring to the FIGURE, a container data center 10 in accordance with an exemplary embodiment includes a mobile container 12 and a plurality of server systems 14 installed in the container 12.

The container 12 includes a bottom wall 120, an inner container portion 122, and an outer container portion 124. The inner container portion 122 includes a first top wall 126 opposite the bottom wall 120, and a number of first sidewalls 128 substantially perpendicularly connected between the bottom wall 120 and sides of the first top wall 126. The first sidewalls 128 are in seamless connection in a head-to-tail fashion. The bottom wall 120 and the inner container portion 122 cooperatively form a receiving room 20. The server systems 14 are received in the receiving room 20. In this embodiment, the receiving room 20 is in a shape of rectangular parallelepiped. The outer container portion 124 includes a second top wall 130, and a number of second sidewalls 132 substantially perpendicularly connected between sides of the bottom wall 120 and sides of the second top wall 130. The second sidewalls 132 are in seamless connection in a head-to-tail fashion. In this embodiment, the first top wall 126 is aligned with the second top wall 130, and has a dimension substantially smaller than that of the second top wall 130. The first sidewalls 128 face the respective second sidewalls 132, and have dimensions substantially smaller than those of the respective second sidewalls 132. Thus the inner container portion 122 is spaced apart from and surrounded by the outer container portion 124. A passage is formed between the first and second top wall 126, 130 and between the first and second sidewalls 128, 132.

The second top wall 130 defines a plurality of first through holes 134, and two opposite second sidewalls 132 defines a plurality of second through holes 136. In this embodiment, the first through holes 134 include a number of slots 138 defined at the central portion of the second top wall 130, and a number of rounded holes 140 aligned along edges of the second top walls 130. The slots 138 are surrounded by the rounded holes 140. The second through holes 136 are rounded, and are aligned along two opposite edges of each of the two opposite second sidewalls 132 perpendicular to the second top wall 130.

The container 12 has good thermal conduction. A material of the container 12 can be metal. Preferably, the container 12 is steel materials with a low cost.

When the sun shines on the container 12, a temperature of the outer container portion 124 rises. Because the container 12 is thermally conductive, the air in the space between the outer container portion 124 and the inner container portion 122 warms up causing it to expand. Then the warm air rises to the space between the first top wall 126 and the second top wall 130, and escapes to the exterior through the first through holes 134. The second through holes 136 can absorb exterior cold gases into the space between the outer container portion 124 and the inner container portion 122 to maintain a stable air pressure and a stable temperature. Therefore, the space between the outer container portion 124 and the inner container portion 122 forms a convection space for the dissipation of the heat generated by the sun.

The first through holes 134 and the second through holes 136 can also be other shapes. In an alternative embodiment, the second through holes 136 can be arranged in all four second sidewalls 132. The shape of the container 12 can also be other shapes.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A container data center comprising:
   a mobile container comprising:
      a bottom wall,
      an inner container portion comprising a first top wall opposite to the bottom wall, and a plurality of first sidewalls connected between the first top wall and the bottom wall, and
      an outer container portion comprising a second top wall facing the bottom wall, and a plurality of second sidewalls connected between the second top wall and the bottom wall, the second sidewalls surrounding the inner container portion, the outer container portion having a dimension larger than that of the inner container portion such that a passage is formed between the first and second top walls and between the first and second sidewalls, the second top wall defining a plurality of first through holes, the second sidewalls defining a plurality of second through holes; and
   a plurality of server systems installed in the inner container portion.

2. The container data center of claim 1, wherein the second top wall defines a plurality of slots at a central portion thereof.

3. The container data center of claim 2, wherein the first through holes are aligned along edges of the second top wall.

4. The container data center of claim 2, wherein the slots are surrounded by the first through holes.

5. The container data center of claim 1, wherein the outer container has a shape of rectangular parallelepiped.

6. The container data center of claim 5, wherein the second through holes are arranged in opposite two of the four second sidewalls.

7. The container data center of claim 6, wherein the second through holes are aligned along opposite edges of each of the two opposite second sidewalls.

* * * * *